(12) United States Patent
Nakagawa et al.

(10) Patent No.: US 6,181,544 B1
(45) Date of Patent: Jan. 30, 2001

(54) CERAMIC ELECTRONIC COMPONENT

(75) Inventors: Takuji Nakagawa, Takefu; Yoshikazu Takagi, Sabae; Akira Nakamura; Masaru Takahashi, both of Takefu, all of (JP)

(73) Assignee: Murata Manufacturing Co., Ltd. (JP)

( * ) Notice: Under 35 U.S.C. 154(b), the term of this patent shall be extended for 0 days.

(21) Appl. No.: 09/337,835

(22) Filed: Jun. 22, 1999

(30) Foreign Application Priority Data

Jun. 24, 1998 (JP) .................................................. 10-177772
Mar. 19, 1999 (JP) .................................................. 11-075533

(51) Int. Cl.⁷ ...................................................... H01G 4/06
(52) U.S. Cl. .................... 361/321.1; 361/306.1; 361/308.1
(58) Field of Search ........................ 361/306.1, 308.1–2, 361/309, 310, 321.1, 321.2, 321.4, 321.5, 328

(56) References Cited

U.S. PATENT DOCUMENTS

| | | | |
|---|---|---|---|
| 4,740,863 | * | 4/1988 | Langlois ................. 361/309 |
| 5,812,363 | * | 9/1998 | Kuroda et al. ............ 361/306.3 |
| 5,963,416 | * | 10/1999 | Honda et al. ............ 361/306.1 |
| 6,046,902 | * | 4/2000 | Nakagawa et al. ........ 361/306.1 |

FOREIGN PATENT DOCUMENTS

| | | |
|---|---|---|
| 0229286 | 12/1986 | (EP) . |
| 2027274 | 2/1980 | (GB) . |
| 1-144611 | 6/1989 | (JP) . |
| 1-144612 | 6/1989 | (JP) . |
| 97/28543 | 8/1997 | (WO) . |

OTHER PUBLICATIONS

United Kingdom Search Report issued Aug. 26, 1999 in connection with a related application.

* cited by examiner

Primary Examiner—Kristine Kincaid
Assistant Examiner—Nguyen Ha
(74) Attorney, Agent, or Firm—Ostrolenk, Faber, Gerb & Soffen, LLP

(57) ABSTRACT

A projection 23 is formed on a connecting terminal part 22 opposing to a side surface 16 of a ceramic electronic component main body 12 in a terminal member 19 by processing the metal plate which provides this terminal member 19. This projection 23 is made to project toward the side surface 16 of the ceramic electronic component main body 12. The interval more than the predetermined dimension is reliably formed between the connecting terminal part 22 and the side surface 16 of the ceramic electronic component main body 12 by the projection 23. This prevents the solder from reaching even to the ceramic electronic component main body 12.

9 Claims, 3 Drawing Sheets

CERAMIC ELECTRONIC COMPONENT

BACKGROUND OF THE INVENTION

1. Technical Field

This invention relates to a ceramic electronic component. Especially, for example, it relates to the structure of a terminal part of the ceramic electronic component which includes a chip type ceramic electronic component main body such as a laminated ceramic capacitor.

2. Prior Art

For example, a case where a ceramic electronic component such as a laminated ceramic capacitor is mounted on a wiring board including aluminum which has superior heat-dissipation property is considered. Since the difference of the thermal expansion coefficient between the aluminum substrate and the ceramic electronic component is large, in a heat cycle which repeats the raise and descent of temperature, there is a problem to generate the destruction of a ceramic electronic component, etc. easily. Especially, in the case of the laminated ceramic capacitor using Pb-system ceramic dielectric having high capacitance, which is required in the power-supply marketplace, since the resistance to breakage thereof is comparatively low, it is easier to generate this problem.

In order to solve an above-mentioned problem, the ceramic electronic component 1 of the structure shown in FIG. 4 is proposed, and offered for practical use.

The ceramic electronic component 1 shown in FIG. 4 includes two chip type ceramic electronic component main bodies 2 for forming a laminated ceramic capacitor, for example. A terminal electrode 3 is formed on both ends of each electronic-component main body 2. These electronic-component main bodies 2 are piled up vertically, and are mutually joined through the adhesive agent (not illustrated).

A terminal member 4 is attached in common to each terminal electrode 3 of two electronic component main bodies 2. More specifically, the terminal member 4 includes a metal plate. The terminal member 4 is connected to each terminal electrode 3 at the base of the terminal member 4 by using solder a conductive junction material such as an electro-conductive glue. Moreover, a portion spread out from the base of the terminal member 4 is bent to the base. By that, a connecting terminal part 6 to a wiring board 5 shown with a imaginary line is provided. This connecting terminal part 6 is positioned opposing to a side surface 7 of the electronic component main body 2 positioned downwardly, said side surface 7 facing downwardly.

Such a ceramic electronic component 1 is mounted by soldering the connecting terminal part 6 of each terminal member 4 to the wiring board 5 by solder 8.

PROBLEM TO BE SOLVED

However, the objective of attaching the terminal member 4 is to absorb stress generated by a deformation or a movement of these terminal member 4 based on expansion and contraction of the wiring board 5 by the temperature change. Also, the objective of attaching the terminal member 4 is to prevent that the electronic component main body 2 is destroyed by the heat shock. Nevertheless, the solder 8 provided for mounting may show the behavior contrary to such an objective.

Namely, not only that the solder 8 is provided on a surface facing outside of the terminal member 4, but also that the solder 8 is provided on a surface facing inside of the terminal member 4, that is a portion spread from the base of the terminal member 4. The latter solder 8 may reach to the electronic component main body 2.

Thus, as shown in FIG. 4, the solder 8 connects the terminal electrode 3 and the wiring board 5 directly, which prevents the terminal member 4 from deforming and moving in order to absorb the stress generated based on the expansion and contraction of the wiring board 5 by the temperature change. Therefore, the objective of providing the terminal member 4 for preventing the electronic component main body 2 from breaking by the thermal shock cannot be attained preferably.

Moreover, solder 8 provides a heat shock to the electronic component main body 2. By this, the electronic component main body 2 may be destroyed. Or even if it does not result in the destruction of the electronic component main body 2 at that time, the stress which may bring the destruction later by the temperature change may be provided to the electronic component main body 2.

Especially, these problems are more serious, when the electronic component main body 2 having comparatively low resistance to breakage such as the laminated ceramic capacitor using Pb ceramic dielectric is provided, or in the case where the aluminum substrate with a large thermal expansion coefficient is used as a wiring board 5.

In order to solve the above mentioned problem, it is effective to lengthen the part spread out from the base in the terminal member 4, and to release the connecting terminal part 6 from the side surface 7 of the electronic component main body 2 sufficiently. However, when adopting such solution means, it is necessary to control the length of the part spread out from the base of the terminal member 4 so that there is no variation. So, there is such a problem that the locating mechanism for performing the appropriate alignment between the terminal member 4 and the electronic component main body 2, etc. may be complicated.

Consequently, the objective of this invention is to offer the ceramic electronic component which can solve the above mentioned problem.

SUMMARY OF THE INVENTION

SOLUTION TO THE PROBLEM

This invention is related to a ceramic electronic component which includes a chip-type ceramic electronic component main body which has two opposing end faces and a side surface which couples between the two end faces, wherein a terminal electrode is provided on said each end face; a terminal member including a metal plate, wherein a base of the metal plate is connected to said each terminal electrode and a portion spread out from said base is bent to said base in a direction opposing to said side surface of said ceramic electronic component main body to provide a connecting terminal part for connecting with a wiring board. In order to solve the above mentioned problem, the present invention is characterized in that a projection which projects toward said surface of said ceramic electronic component main body is provided with said connection terminal part, said projection is formed by processing said metal plate.

Preferably in this invention, the projection is formed by performing the swelling process of the metal plate.

Moreover, preferably in this invention, the base of the terminal member is bent in a U-shape. A solder affinity surface which gets accustomed to solder is formed on the surface which faces outside in the bending condition of this terminal member. And, a solder non-affinity surface which does not get accustomed to solder is formed on the surface which faces inside in the bending condition of the terminal member.

Preferably in this invention, the projection may be provided so as to contact with the side surface of the ceramic electronic component.

Further, when the terminal electrode has a side surface elongated portion which extends to a part of the side surface of the ceramic electronic component in this invention, as described above, the base of the terminal member is bent in a U-shape. And a solder affinity surface is formed on the surface facing outside in the bending condition of the terminal member, and a solder non-affinity surface is formed on the surface facing inside in the bending condition of the terminal member. In such a case, the projection may be positioned so that it projects to the side surface elongated portion of the terminal member.

Further, as described above, when the projection is positioned so as to project to the side surface elongated portion of the terminal electrode, this projection may be contacted to the side surface elongated portion.

Moreover, the ceramic electronic component based on this invention includes a plurality of ceramic electronic component main bodies. Terminal members may have the structure to be attached in common to each terminal electrode of these plurality of ceramic electronic component main bodies.

Further, preferably in this invention, the swelling part which projects toward the terminal electrode side is formed on the base of the terminal member.

DETAILED DESCRIPTION OF THE PREFERRED EMBODIMENTS

Figure 1:
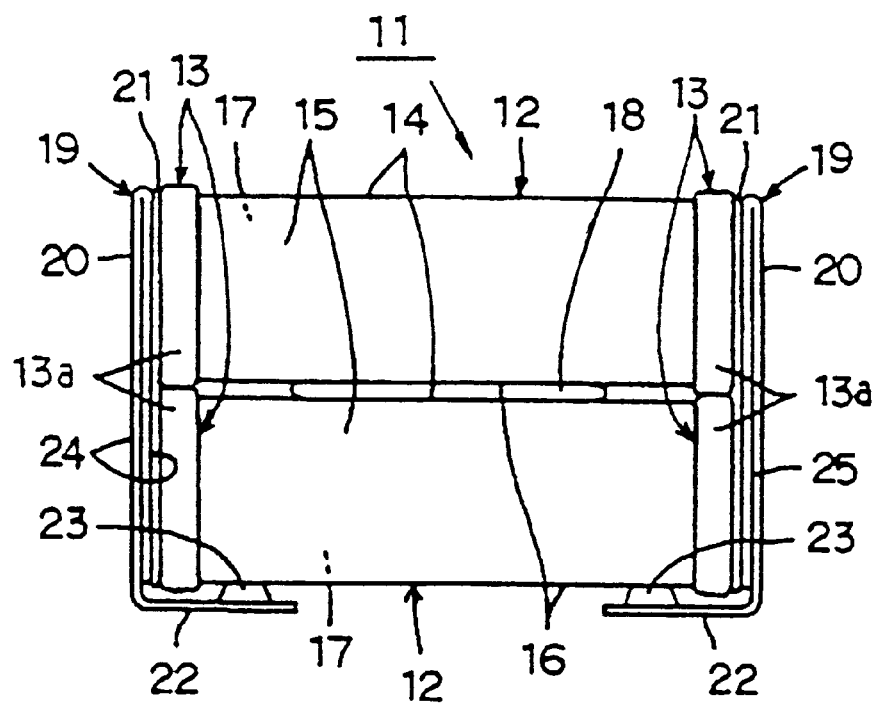
FIG. 1 is a front view showing an outside view of the ceramic electronic component 11 of one embodiment of the present invention.

With reference to FIG. 1, the ceramic electronic component 11 includes two chip type ceramic electronic component main bodies 12 which provide a laminated ceramic capacitor, for example. The electronic component main body 12 has two end faces facing opposite to each other, and a terminal electrode 13 is formed on each end face. The terminal electrode 13 may be formed by thin film coating technologies, such as sputtering, deposition, and plating. Or, the terminal electrode 13 may be formed by thick film forming method in which a conductive paste may be provided and fired. Furthermore, it may be formed by plating the thick film formed by the thick film forming method.

Moreover, the electronic component main body 12 has four side surfaces 14, 15, 16, and 17 which couples between the above-mentioned two end faces. Mutually orienting with the same position, the two electronic component main bodies 12 are piled up vertically. Those two electronic component main bodies are joined with an adhesive agent 18, for example. At this time, it is in the condition that the side surface 16 which faces downwardly from the upper electronic component main body 12 and the side surface 14 which faces upwardly from the upper part of the lower electronic component main body 12 face oppositely and mutually.

The terminal member 19 is attached in common to each terminal electrode 13 of the performed above-mentioned two electronic-component main bodies 12. The terminal member 19 is independently shown in FIG. 2 by the side view. Moreover, it is shown in FIG. 3 by the plan view.

Each terminal member 19 includes a metal plate. The terminal member 19 is attached to a pair of associated terminal electrodes 13 by solder or other conductive junction material 21 such as an electro-conductive glue. When the solder is used as the conductive junction material 21, in order to attach the terminal member 19, a solder dip coating, a solder reflow method, or the like can be used.

The part spread out extending from the base 20 of the terminal member 19 is bent relative to the base 20 so as to be opposed to and spaced from the side surface 16 which faces downwardly from the lower electronic component main body 12 to provided a connecting terminal part 22 for connection with a wiring board (not illustrated). A respective pair of projections 23, formed by performing the swelling process of the metal plate which provides the terminal member 19 using a press die, for example, extends from each connecting terminal part 22. Each projection 23 project toward the side surface 16 which faces downwardly from the lower electronic component main body 12.

The projection 23 have a height of about 100 micrometers, for example. This reliably ensures that the connecting terminal part will be spaced and predetermined interval from the side surface 16 which faces downwardly from the lower electronic component main body 12. Moreover, the projection 23 facilitate the alignment of the electronic component main body 12 and the terminal member 19. So far as such an objective is attained, the number, the position or the shape of the projection 23 can be changed arbitrarily. Further, regarding the processing method of the metal plate for forming the projection 23, in stead of the swelling process, cut-raising process or the like may be replaced with.

Further, as shown in FIG. 1, the terminal electrode 13 has a side surface elongated portion 13a which extends to a part of the side surfaces 14 to 17 of the electronic component main body 12. In this embodiment, the projection 23 is not contacted to the side surface elongated portion 13a of the terminal electrode 13, but it is contacted to the side surface 16 of the lower electronic component main body 12. In this way, when the projection 23 is contacted to the side surface 16 of the electronic component main body 12, it is possible that the alignment of the terminal member 19 and the electronic component main body 12 is performed more easily, more securely, and without variation.

Moreover, it is not essential that the projection 23 contacts with the side surface 16 which faces downwardly from the lower electronic component main body 12 as mentioned above. In addition, when the projection 23 contacts with the side surface 16 of the lower electronic component main body 12, it is desirable that the projection contacts with the side surface 16 in an area as small as possible, for example, by a point contact or a line contact.

In this embodiment, the base 20 of the terminal member 19 is bent in a U-shape. And, the solder affinity surface 24 which gets accustomed to solder is formed on the surface facing outside in the bending condition of the terminal member 19. And, the solder non-affinity surface 25 which does not get accustomed to solder is formed on the surface facing inside in the bending condition of the terminal member 19.

In order to provide the above described solder affinity surface 24 and the solder non-affinity surface 25, as one example, a metallic material having a bad soldering property such as stainless steel is used as a metallic plate for the terminal member 19, for example. A surface of this metal plate is the solder non-affinity surface 25 as it is. A film which includes solder, silver, gold, tin, etc. is formed on the solder affinity surface 24 by the plating or the like, for example.

Moreover, instead of this, a metallic material having a favorable soldering property such as a copper alloy is used as a metallic plate of the terminal member 19, for example. The solder affinity surface 24 is provided by the surface of such a metal plate itself. The solder non-affinity surface 25 may be provided by processing the surface of this metal plate so that it may not get accustomed to solder. As a process for making the metallic plate not to get accustomed to solder, there may be a method of forming the film or the coating comprising resin, or giving the chemical preparation such as oxidizing the surface of a metal plate, for example.

Figure 2:
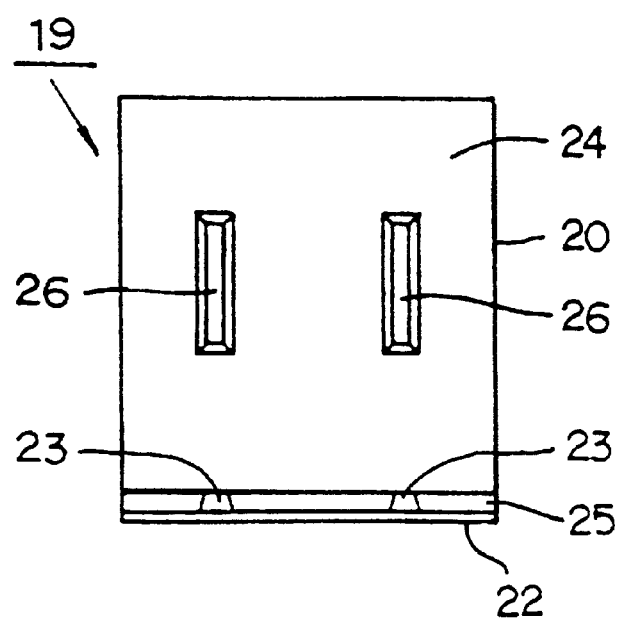
FIG. 2 is a side view showing the terminal member 19 shown in FIG. 1.
Figure 3:
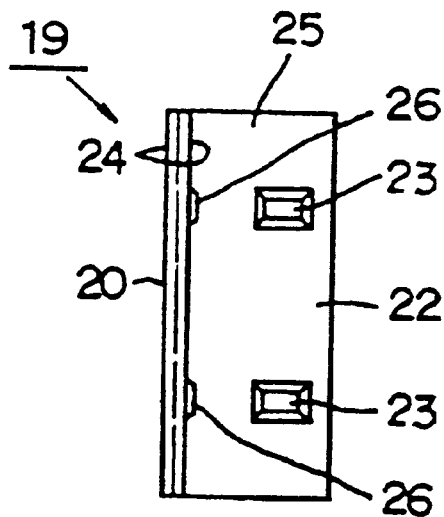
FIG. 3 is a plan view showing the terminal member 19 shown in FIG. 1.

Further, in this embodiment, as shown in FIG. 2 and FIG. 3, in the base 20 of the terminal member 19, the swelling part 26 is formed by performing the swelling process of the metal plate, for example. The swelling part 26 has the shape which projects toward the terminal electrode 13 side. Such a swelling part 26 forms a predetermined space reliably between the base 20 of the terminal member 19 and the terminal electrode 13. This swelling part 26 makes it easier to form the above mentioned conductive junction material 21 uniformly and with predetermined thickness.

Moreover, by this embodiment, the above-mentioned swelling part 26 is extended to the bending line of the terminal member 19 in the direction (specifically, orthogonal direction) to intersect as well shown in FIG. 2.

The shape of the swelling part 26 has a long rib. Therefore, the swelling part 26 enhances strength of the terminal member 19 and prevents the generation of undesirable transformation. So, the terminal member 19 can be formed with a comparatively thin metal plate.

Further, although not illustrated, a similar swelling part is formed also in a part which is overlapping with the part on which the swelling part 26 was formed in the base 20 of the terminal member 19. This swelling part and the illustrated swelling part 26 may be engaged mutually. Such an engagement of the swelling part 26 is effective for preventing the undesirable transformation in the base 20 of the terminal member 19.

The above-mentioned swelling part 26 can be substantially formed in the identical process by the same processing method as that of the projection 23. Therefore, the number of processes for obtaining the terminal member 19 does not increase by forming the swelling part 26.

Such a ceramic electronic component 11 is made to the mounting condition by soldering the connecting terminal part 22 of each terminal member 19 to a wiring board (not illustrated).

The solder (not illustrated) provided in above-mentioned soldering is going around so that the connecting-terminal part 22 and the wiring board may be connected. A desired electric connection and the mechanical suspension are attained. At this time, because the interval more than the predetermined dimension is reliably formed by existing of the projection 23 between the connecting-terminal part 22 and the side surface 16 facing downwardly from the lower electronic-component main body 12, this configuration can reliably prevent the above mentioned solder from reaching even to the lower electronic-component main body 12.

Therefore, for example, it can reliably prevent the bridge which comprising solder from generating between the connecting-terminal part 22 and the terminal electrode 13. The deformation or the movement of the terminal member 19 for absorbing stress is not inhibited. The objective of providing the terminal member 19 is attained appropriately, it also prevents the solder from giving a heat shock to the electronic-component main body 12.

Moreover, in this embodiment, as mentioned above, the base 20 of the terminal member 19 is bent in a U-shape. The solder affinity surface 24 is formed on the surface facing outside in this bending condition of the terminal member 19, and the solder non-affinity surface 25 is formed on the surface facing inside thereof.

Therefore, in the connecting-terminal part 22, the surface facing to a wiring-board side is the solder affinity surface 24, and the surface on which the projection 23 is provided is the solder non-affinity surface 25. This also contributes to prevent the solder from drifting to a undesirable part. That is, it is difficult for solder to go around the side of the connecting terminal part 22 in which the projection 23 is provided, namely, thus it is difficult to reach to the lower electronic component main body 12. On the other hand, since the solder affinity surface 24 is formed on the surface opposing to the wiring board of the connecting-terminal part 22, the solder can go around quickly between the connecting-terminal part 22 and the wiring board.

Moreover, in the base 20 of the terminal member 19, since the surface facing inside in the bending condition is the solder non-affinity surface 25, it is difficult for solder to go around between the surfaces facing inside of the base 20. Therefore, bridges made of solder are not generated at this part. Thus, the movement of the base of the terminal member 19 is not inhibited and the stress can be preferably absorbed in the base 20.

Figure 4:
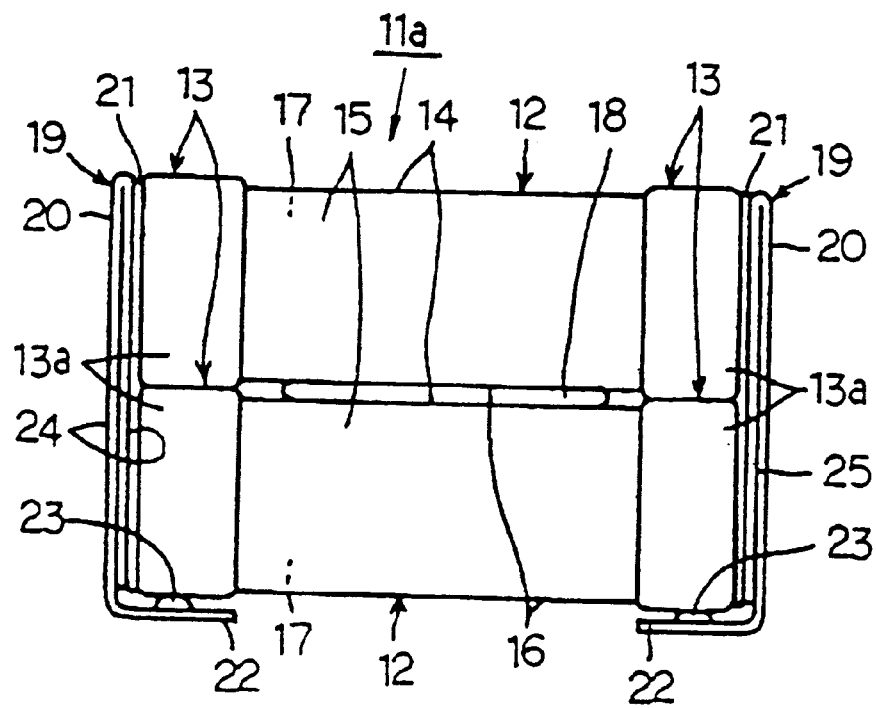
FIG. 4 is a front view showing an outside view of the ceramic electronic component 11a of another embodiment of the present invention.
Figure 5:
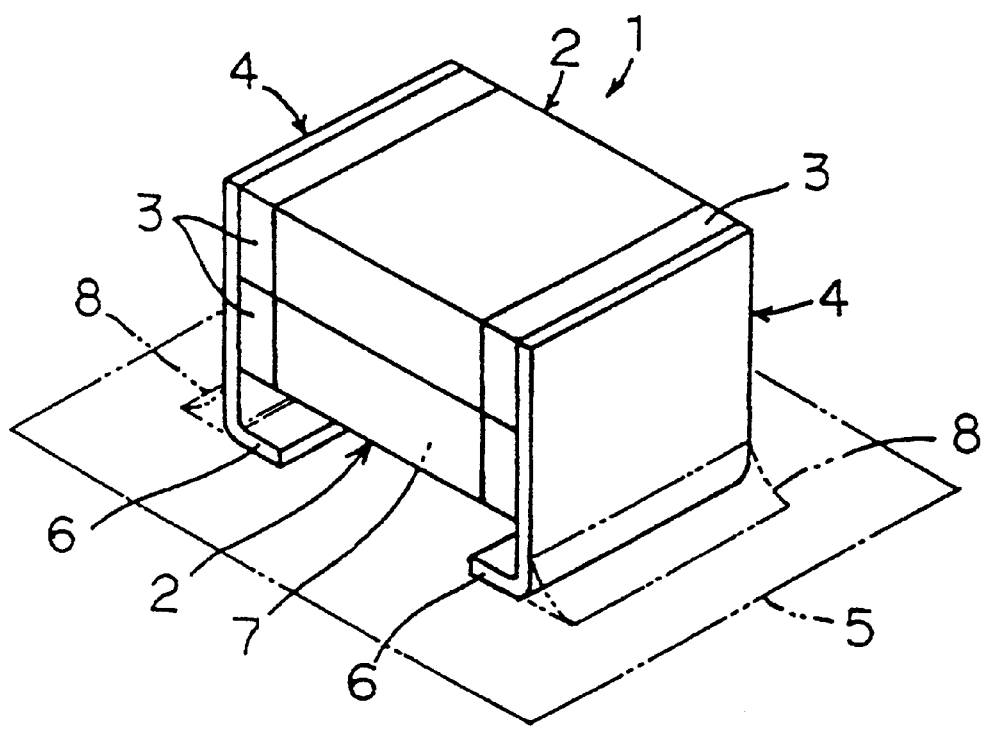
FIG. 5 is a perspective view showing an outside view of the conventional ceramic electronic component 1, and the imaginary line shows the mounting condition of the electronic component to a wiring board 5.

FIG. 4 is a front view showing the ceramic electronic component 11a according to another embodiment of the present invention. FIG. 4 corresponds with above described FIG. 1. However, since the ceramic electronic component 11a shown in FIG. 4 has many common elements of the ceramic electronic component 11 shown in FIG. 1, corresponding elements are referred with the same reference numbers and the repeated explanation is omitted.

In the ceramic electronic component 11a shown in FIG. 4, it is characterized in that a projection 23 formed on a connecting terminal portion 22 of a terminal member 19 is located so that it projects toward a side surface elongated part 13a of a terminal electrode 13 of a lower electronic component main body 12. Also, it is not a fundamental characteristic, but the side surface elongated part 13a of the terminal electrode 13 is formed over side surfaces 14 to 17 of the electronic component main body 12, which has wider area comparing with the case of the ceramic electronic component 11 shown in FIG. 1.

In this way, the length of the connecting terminal part 22 of each terminal member 19 can be shorten by positioning the projection 23 to be projected toward the side surface elongated portion 13a of the terminal electrode 13. Therefore, the dimension between the respective connecting terminal parts 22 of two terminal members 19 can be shortened. As a result, withstand voltage of the ceramic electronic component 11a can be improved.

As described above, although the projection 23 is positioned to be projected toward the side surface elongated portion 13a of the terminal electrode 13, the bridges or the like made of solder are not generated between the projection 23 and the terminal electrode 13 of the lower electronic component main body 12. For, as described above, the solder affinity surface 24 is formed on the side where the projection 23 of the terminal member is provided. Therefore, the deformation or the movement of the terminal member 19 for absorbing the stress is not inhibited. Thus, the objective of providing the terminal member 19 is appropriately attained and it prevents the solder from giving thermal shock to the electronic component main body 12.

Further, according to this embodiment, when an interval which is more than the predetermined dimension is formed between the connection terminal part 22 of the terminal member 19 and the side surface 16 facing downwardly from the lower electronic component main body 12, compared to the case of the ceramic electronic component 11 shown in FIG. 1, the height of the projection 23 can be made shorter because of the thickness of the side surface elongated portion 13a of the terminal electrode 13. Thus, a process such as a press processing for manufacturing the terminal member 19 which includes a process for forming the projection 23 can be made easier.

Further, in this embodiment, as shown in FIG. 4, the projection 23 is contacted to the side surface elongated portion 13a of the terminal electrode 13 of the lower electronic component main body 12. In this way, when the projection 23 is formed to be contacted to the side surface elongated portion 13a of the terminal electrode 13, as in the case of the ceramic electronic component 11 of FIG. 1, alignment between the terminal member 19 and the electronic component main body 12 can be made easier, more securely, and without variation. Further, equivalent series resistance can be reduced because the conductive path from the terminal electrode 13 to the conductive land on the wiring board is shortened in the mounting condition on the wiring board.

If such an advantage is not necessary, the projection 23 needs not contact to the side surface elongated portion 13a of the terminal electrode 13 of the lower electronic component main body 12.

Although the present invention is explained in relation to the embodiment illustrated, the various modification is possible within the limits of this invention.

For example, although the ceramic electronic component 11 illustrated includes two electronic-component main bodies 12, the number of electronic component main bodies can be changed arbitrarily. It may be three or more, or it may simply be one.

Moreover, although the electronic-component main body 12 comprises a laminated ceramic capacitor, the electronic component main body may comprise the ceramic electronic component which has the other function. Moreover, although the electronic-component main body 12 illustrated includes the terminal electrode 13 on two opposing end faces, it may include a terminal electrode on the other parts, such as an intermediate part.

Further, although the terminal member 19 illustrated is bent in a U-shape in the base 20 and is formed into the double fold structure, it may simply be one fold structure.

As mentioned above, according to an embodiment of the invention, a terminal member comprising a metal plate is connected to each terminal electrode formed on each end face of a chip type ceramic electronic-component main body in a base thereof. Also, the part spread out from the base of this terminal member is bent to the base in a direction opposing to a side of the ceramic electronic-component main body and is made to be a connecting-terminal part for the connection with a wiring board. Because a projection which projects toward a side surface of a ceramic electronic-component main body is provided, a space more than a predetermined dimension can be reliably formed between this connecting-terminal part and the side surface of the ceramic electronic-component main body due to the existing of this projection.

As a result, a solder attached to the connecting terminal part for getting the mounting condition of the ceramic electronic component on the wiring board can be prevented from reaching to the ceramic electronic component. Therefore, a bridge due to the solder is not formed between the connecting terminal part and the ceramic electronic component main body. Thus, the deformation or the movement of the terminal member for absorbing stress is not inhibited and the ceramic electronic-component main body is advantageously prevented from being destroyed by the heat shock due to such a bridge etc.

Moreover, the projection provided with the connecting terminal part facilitates the positioning the terminal member to the ceramic electronic-component main body. Therefore, the positioning mechanism or the like for the alignment between these elements can be a simple structure.

Further, the projection provided with the connecting-terminal part can be easily formed using a press die etc., because is formed by processing the metal plate which constructs a terminal member.

If the projection is formed by performing the swelling process of the metal plate, the projection can be formed by a simple processing method.

If the above-mentioned projection is made to contact to the side surface of the ceramic electronic-component main body, the alignment between the terminal member and the ceramic electronic-component main body can be made more easily and more reliably so that there may be no variation.

Moreover, in an embodiment of the invention, the base of the terminal member is bent in a U-shape. The solder affinity surface which gets accustomed to solder is formed on a surface facing outside in the bending condition of this terminal member. And, the solder non-affinity surface which does not get accustomed to solder is formed on a surface facing inside. In such a case, a surface on which the projection of the connecting-terminal part is provided can be made to a solder non-affinity surface. Therefore, it can prevent that the solder goes around between the connecting-terminal part and the ceramic electronic-component main body with the effect of this solder non-affinity surface. On the other hand, a surface facing to the wiring-board side of the connecting-terminal part is made to a solder affinity surface. Therefore, the solder can go around quickly between a connecting-terminal part and the wiring board. The desired electric connection between these elements and the mechanical fixation can be attained satisfactorily. Further, the solder non-affinity surface is formed on a surface facing inside in the bending condition in the base of the terminal member, the solder does not go around between the surfaces facing inside. Therefore, the movement or the transformation of the terminal member for absorbing the stress is not inhibited by such solder.

Moreover, as described above, the base of the terminal member is bent in a U shape. A solder affinity surface is formed on a surface facing outside in the bending condition of the terminal member and a solder non-affinity surface is formed on a surface facing inside in the bending condition. In such a case, even when the projection is positioned to project to the side surface elongated portion of the terminal electrode, the fundamental function of the terminal member is not inhibited. Further, it prevents the solder from giving thermal shock to the electronic component main body. Also, the length of the connecting terminal part of each terminal member can be shortened, thereby reducing the distance between respective connecting terminal parts of the two terminal members. As a result, the withstand voltage can be improved. Further, the height of the projection which is necessary to form an interval more than the predetermined dimension between the connecting terminal part of the terminal member and the side surface facing downwardly from the electronic component can be reduced because of the existence of the thickness of the side surface elongated portion of the terminal electrode. Thus, a process for manufacturing the terminal member can be made easier.

Further, as described above, when the projection is positioned to project toward the side surface elongated portion of the terminal electrode, if the projection is made to be contacted to the side surface elongated portion, as in the case that the projection is contacted to the side surface of the electronic component main body, the positioning between the terminal member and the electronic component main body can be made easier, more securely, and without variation. Further, in the mounting condition on the wiring board, the conductive path from the terminal electrode to the conductive land on the wiring board is shortened, thereby reducing the equivalent series resistance.

Moreover, if the ceramic electronic component based on this invention includes a plurality of ceramic electronic-component main bodies and the terminal member is attached in each terminal electrode of these plurality of electronic-component main bodies in common, these electronic-component main bodies will be electrically connected by the terminal member and these main bodies are fixed mechanically.

Moreover, in an embodiment of the invention, when a swelling part which projects toward the terminal electrode side in the base of the terminal member is provided, the conductive junction material for attaching the terminal member to the terminal electrode will be provided in the space which is defined by the projection of this swelling part. Therefore, the conductive junction material can be formed easily, uniformly, and with the predetermined thickness. Moreover, this swelling part can be substantially formed easily with the identical process by the same processing method as in those of the projection.

Therefore, the number of processes for obtaining a terminal-part material does not increase by forming a swelling part.

What is claimed is:

1. A ceramic electronic component, comprising:
    a chip-type ceramic electronic component main body which includes two opposing end faces and a side surface extending between said end faces, a respective terminal electrode being provided on each of said and faces;
    a pair of terminal members, each terminal member including a metal plate whose base is connected to a respective said terminal electrode, a portion of said metal plate extending from said base so as to oppose and be spaced from said side surface of said ceramic electronic component main body to provide a connecting terminal part for connecting with a wiring board; and
    a respective projection associated with each of said connecting terminal parts and projecting toward said side surface of said ceramic electronic component main body.

2. A ceramic electronic component according to claim 1, wherein each of said projections arc formed by perform a swelling process on its associated metal plate.

3. A ceramic electronic component according to either one of claims 1 or 2, wherein said base of each of said terminal members is bent in a U-shape with a pair of solder non-affinity surfaces facing one another and a pair of solder anity surfaces facing away from one another.

4. A ceramic electronic component according to either one of claim 1 or 2, wherein each of said projections is in contact with said side surface.

5. A ceramic electronic component according to claim 4, wherein each of said terminal electrodes includes a side portion located on said side surface and wherein each of said projections extends toward an associated one of said side portions.

6. A ceramic electronic component according to claim 5, wherein each of said projections are in contact with an associated one of said side portions.

7. A ceramic electronic component according to either one of claims 1 and 2, wherein each of said terminal members includes a swelling portion formed in its base and projecting toward said side surface of said ceramic electronic component main body.

8. A ceramic electronic component, comprising:
    a pair of chip-type ceramic electronic component main bodies, each of said chip-type ceramic electronic component main bodies including two opposing end faces and a side surface extending between said end faces, a respective terminal electrode being provided on each of said end faces;
    a pair of terminal members, each terminal member including a metal plate whose base is connected to a respective said terminal electrode of each of said ceramic electronic component main bodies, a portion of said metal plate extending from said base so as to oppose and be spaced from said side surfaces of a first one of said ceramic electronic component main bodies to provide a connecting terminal part for connecting with a wiring board; and
    a respective projection associated with each said connecting terminal part and projecting toward said side surface of said first one of said ceramic electronic component main bodies.

9. A ceramic electronic component according to claim 8, wherein each of said projections are formed by performing a swelling process on its associated metal plate.

* * * * *